US011143545B2

(12) United States Patent
Hayzen et al.

(10) Patent No.: US 11,143,545 B2
(45) Date of Patent: Oct. 12, 2021

(54) THINNING OF SCALAR VIBRATION DATA

(71) Applicant: Computational Systems, Inc., Knoxville, TN (US)

(72) Inventors: Anthony J. Hayzen, Knoxville, TN (US); Christopher G. Hilemon, Knoxville, TN (US)

(73) Assignee: Computational Systems, Inc., Knoxville, TN (US)

( * ) Notice: Subject to any disclaimer, the term of this patent is extended or adjusted under 35 U.S.C. 154(b) by 386 days.

(21) Appl. No.: 16/273,684

(22) Filed: Feb. 12, 2019

(65) Prior Publication Data
US 2020/0256721 A1   Aug. 13, 2020

(51) Int. Cl.
G01H 9/00 (2006.01)
G01H 1/16 (2006.01)
H03M 7/30 (2006.01)

(52) U.S. Cl.
CPC ............ G01H 1/16 (2013.01); H03M 7/3059 (2013.01)

(58) Field of Classification Search
CPC .......... G01H 17/00; G01H 1/00; G01H 1/006; G01H 1/003; G01H 1/16; H03M 1/0827; H03M 1/1225; H03M 1/12; H03M 1/124; H03M 1/66; H03M 7/30; H03M 7/3059
USPC ........................................................ 341/87
See application file for complete search history.

(56) References Cited

U.S. PATENT DOCUMENTS

| | | |
|---|---|---|
| 4,660,145 A | 4/1987 | Hansen |
| 4,720,806 A | 1/1988 | Schippers et al. |
| 5,148,501 A | 9/1992 | Enomoto et al. |
| 5,243,343 A | 9/1993 | Moriyasu |
| 5,602,749 A | 2/1997 | Vosburgh |
| 6,507,804 B1 * | 1/2003 | Hala ...................... G01H 1/003 702/182 |
| 9,229,853 B2 | 1/2016 | Khan et al. |
| 10,015,272 B2 | 7/2018 | Zhong et al. |
| 10,337,911 B2 * | 7/2019 | Cheung .............. G01B 9/02083 |
| 2012/0303163 A1 * | 11/2012 | Compains Pascualena ................. D06F 37/304 700/275 |
| 2016/0054171 A1 * | 2/2016 | Maalouf ................ G01H 1/006 702/56 |
| 2018/0271431 A1 * | 9/2018 | Lee ...................... A61B 5/6844 |
| 2019/0048556 A1 * | 2/2019 | Kasahara ............... G01H 17/00 |

(Continued)

FOREIGN PATENT DOCUMENTS

WO   1999019698 A1   4/1999

Primary Examiner — Linh V Nguyen
(74) Attorney, Agent, or Firm — Luedeka Neely Group, PC (57) ABSTRACT

A process for thinning scalar machine vibration data can reduce the amount of data storage required to store the data by several orders of magnitude, without losing any important machine diagnostic vibration information. The process assumes that because each scalar vibration measurement value has its own range of values, there is a unique delta change in value that does not significantly impact machine diagnostic information provided by the data. Some embodiments provide a method to automatically evaluate the delta change in value. The process can be used to thin data that have already been stored in a database, and also to thin the data in real-time during data collection. Data storage structures for storing the thinned scalar values and processes for displaying a trend plot to indicate where the scalar data have been thinned are also described.

12 Claims, 9 Drawing Sheets

(56) References Cited

U.S. PATENT DOCUMENTS

| | | | |
|---|---|---|---|
| 2019/0234793 A1* | 8/2019 | Matsuura | G01M 1/14 |
| 2019/0323922 A1* | 10/2019 | Acur | G01M 13/045 |
| 2020/0124452 A1* | 4/2020 | Bitto | G01F 1/74 |
| 2020/0363287 A1* | 11/2020 | Kinoshita | E01D 22/00 |
| 2021/0088418 A1* | 3/2021 | Sato | G01M 13/045 |

* cited by examiner

THINNING OF SCALAR VIBRATION DATA

FIELD

This invention relates to the field of machine vibration data measurement and storage. More particularly, this invention relates to a system for thinning scalar vibration data to reduce data storage requirements by several orders of magnitude, without losing important machine diagnostic vibration information.

BACKGROUND

Continuous online machine vibration monitoring devices can be configured to acquire and store very large quantities of scalar (trend) vibration measurement data. The Model AMS 6500 ATG by Emerson Process Management is an example of one such device that can acquire and store several megabytes of data per hour. If there are several hundred such devices in a plant, the amount of data per hour may reach several gigabytes. Over a long time frame, the amount of vibration data can become unmanageable, and some What is needed, therefore, is a process for thinning down the large volumes of collected data without losing important vibration information.

SUMMARY

Depending on configuration variables, the data thinning process described herein can reduce by several orders of magnitude the amount of data storage required, without losing any important machine diagnostic vibration information. Some embodiments of the process can be used to thin data that have already been stored in a database. Some embodiments can be used in a real-time process to thin data before storage in a database.

Generally, each scalar vibration measurement value has its own range of values and delta change in value that does not have a significant impact on machine vibration information. A preferred embodiment described herein provides a method to automatically evaluate the delta change in value. In another aspect, embodiments described herein provide data storage structures for storing the thinned scalar values. In yet another aspect, embodiments described herein provide a process to display a trend plot to indicate where the scalar data have been thinned out.

Some embodiments described herein are directed to a computer-implemented method for thinning scalar measurement data to reduce an amount of space needed in a second data storage device to save the scalar measurement data. The scalar measurement data were initially recorded in a first data storage device during a measurement period. A preferred embodiment of the method includes:

(a) accessing the scalar measurement data from the first data storage device;
(b) setting an amplitude range to which a plurality of amplitude values of the scalar measurement data will be compared;
(c) setting a first or subsequent one of the amplitude values as a reference amplitude value, and setting a time corresponding to the first or subsequent one of the amplitude values as a reference time value;
(d) saving the reference amplitude value and the reference time value in the second data storage device;
(e) accessing a next amplitude value of the plurality of amplitude values from the first data storage device;
(f) determining whether an absolute difference between the reference amplitude value and the next amplitude value is greater than the amplitude range, and
   if the absolute difference between the reference amplitude value and the next amplitude value is not greater than the amplitude range:
      discarding the next amplitude value by not saving it in the second data storage device; and
      proceeding to step (g), or
   if the absolute difference between the reference amplitude value and the next amplitude value is greater than the amplitude range:
      saving in the second data storage device the next amplitude value and a time at which the next amplitude value was recorded; and
      setting the next amplitude value as the reference amplitude value, and setting the time at which the next amplitude value was recorded as the reference time value; and
(g) repeating steps (e) and (f) until all of the scalar measurement data recorded during the measurement period have been processed.

In some embodiments, step (b) includes setting the amplitude range based on a median value of a moving standard deviation of the plurality of amplitude values of the scalar measurement data across the measurement data recorded during the measurement period.

In some embodiments, the first data storage device comprises a data buffer in a vibration data collector, and the second data storage device comprises a data storage device in the vibration data collector, and steps (a) through (g) are performed in real-time as the vibration data collector records the scalar measurement data.

In some embodiments, the first data storage device comprises a data storage device in a vibration data collector, and the second data storage device comprises a vibration database, and steps (a) through (g) are performed after the scalar measurement data has been recorded in the data storage device of vibration data collector.

In some embodiments, if the absolute difference between the reference amplitude value and the next amplitude value is greater than the amplitude range in step (f), the method includes:
   calculating an average measurement value based on a sum of the amplitude values discarded in step (f);
   calculating a time gap value indicating a total length of time associated with the amplitude values discarded in step (f); and
   saving the average measurement value and the time gap value in the second data storage device.

In some embodiments, the method includes generating an amplitude versus time graphical plot of the scalar measurement data stored in the second data storage device. The graphical plot includes one or more data gaps caused by discarding amplitude values in step (f), wherein the one or more data gaps have a time length corresponding to the time gap value. The amplitude values discarded in step (f) are replaced in the one or more data gaps in the plot by the average measurement value or by artificially-generated amplitude values having amplitudes that are randomly distributed around the average measurement value.

In another aspect, some embodiments described herein are directed to an apparatus for thinning scalar measurement data to reduce an amount of space needed to save the scalar measurement data. The apparatus includes a first data storage device in which the scalar measurement data were initially recorded during a measurement period, and a second data storage device in which the scalar measurement data are stored after thinning. The apparatus also includes a processor in communication with the first and second data storage devices. The processor executes instructions to:

(a) access the scalar measurement data from the first data storage device;
(b) set an amplitude range to which a plurality of amplitude values of the scalar measurement data will be compared;
(c) set a first or subsequent one of the amplitude values as a reference amplitude value, and set a time corresponding to the first or subsequent one of the amplitude values as a reference time value;
(d) save the reference amplitude value and the reference time value in the second data storage device;
(e) access a next amplitude value of the plurality of amplitude values from the first data storage device;
(f) determine whether an absolute difference between the reference amplitude value and the next amplitude value is greater than the amplitude range, and
   if the absolute difference between the reference amplitude value and the next amplitude value is not greater than the amplitude range:
      discard the next amplitude value by not saving it in the second data storage device; and
      proceed to step (g), or
   if the absolute difference between the reference amplitude value and the next amplitude value is greater than the amplitude range:
      save in the second data storage device the next amplitude value and a time at which the next amplitude value was recorded; and
      set the next amplitude value as the reference amplitude value, and set the time at which the next amplitude value was recorded as the reference time value; and
(g) repeat steps (e) and (f) until all of the scalar measurement data recorded during the measurement period have been processed.

In some embodiments, the processor sets the amplitude range based on a median value of a moving standard deviation of the plurality of amplitude values of the scalar measurement data across the measurement data recorded during the measurement period.

In some embodiments, the first data storage device comprises a data buffer in a vibration data collector, the second data storage device comprises a data storage device in the vibration data collector, and the processor executes the instructions to perform steps (a) through (g) in real-time as the vibration data collector records the scalar measurement data.

In some embodiments, the first data storage device comprises a data storage device in a vibration data collector, the second data storage device comprises a vibration database, and the processor executes the instructions to perform steps (a) through (g) after the scalar measurement data has been recorded in the data storage device of vibration data collector.

In some embodiments, if the processor determines that the absolute difference between the reference amplitude value and the next amplitude value is greater than the amplitude range, the processor executes instructions to:
   calculate an average measurement value based on a sum of the amplitude values discarded in step (f);
   calculate a time gap value indicating a total length of time associated with the amplitude values discarded in step (f); and
   save the average measurement value and the time gap value in the second data storage device.

In some embodiments, the processor generates an amplitude versus time graphical plot of the scalar measurement data stored in the second data storage device. The graphical plot includes one or more data gaps caused by discarding amplitude values in step (f). The one or more data gaps have a time length corresponding to the time gap value. The amplitude values discarded in step (f) are replaced in the one or more data gaps by the average measurement value, or by artificially-generated amplitude values having amplitudes that are randomly distributed around the average measurement value.

BRIEF DESCRIPTION OF THE DRAWINGS

Other embodiments of the invention will become apparent by reference to the detailed description in conjunction with the figures, wherein elements are not to scale so as to more clearly show the details, wherein like reference numbers indicate like elements throughout the several views, and wherein.

DETAILED DESCRIPTION

Figure 1:
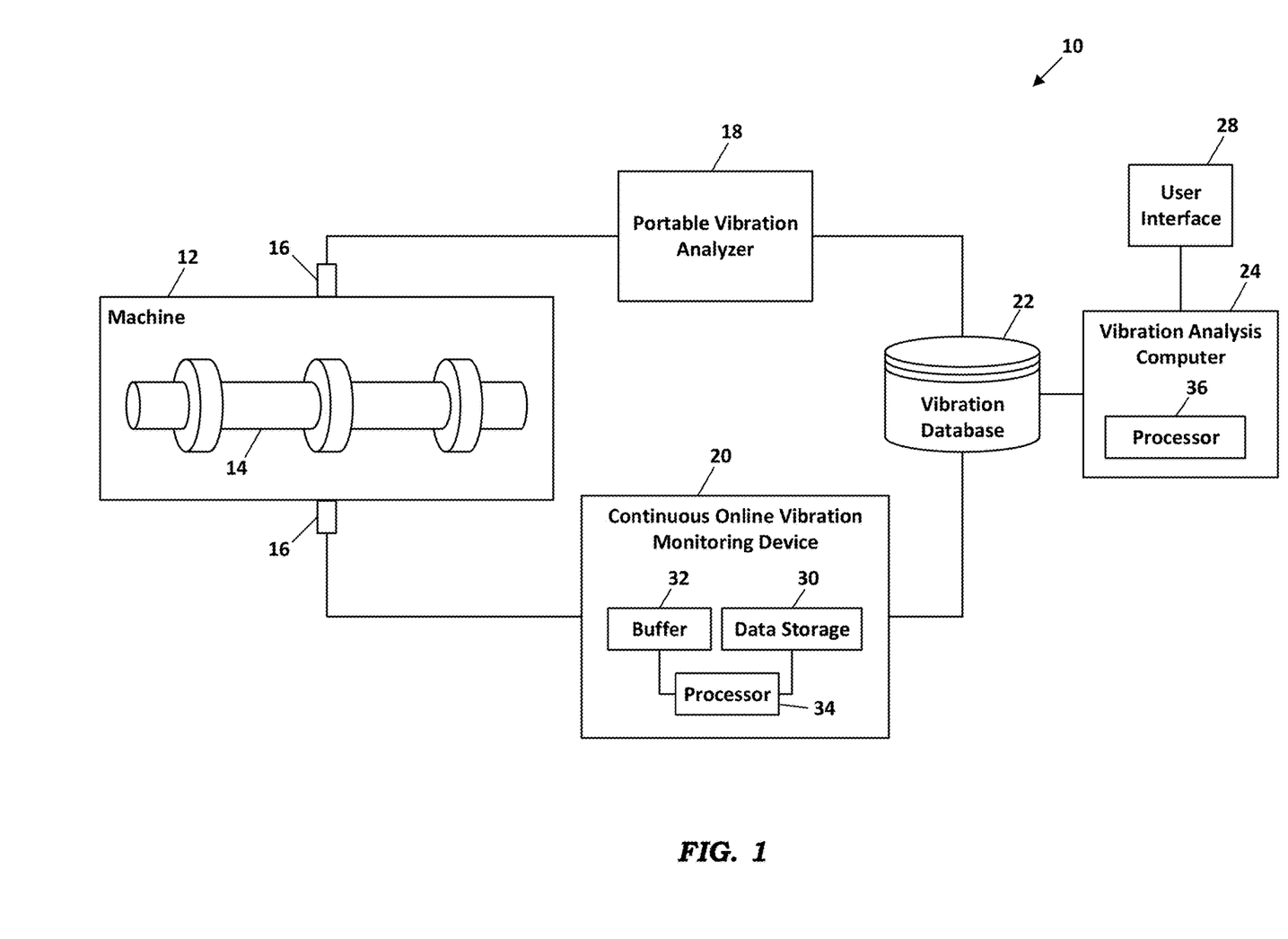
FIG. 1 depicts an apparatus for collecting and thinning scalar measurement data according to an embodiment of the invention.

As depicted in FIG. 1, a vibration measurement and analysis system includes vibration sensors 16 attached to a machine 12. The machine 12 includes at least one rotating component 14, such as a shaft supported by bearings. The vibration sensors 16 generate vibration signals representative of the vibration of the machine 12, which includes vibration components associated with the rotating component 14. The vibration signals are received, conditioned, and converted to time waveform digital data and scalar data by one or more vibration data collectors, such as a portable vibration analyzer 18 or a continuous online vibration monitoring system 20. The vibration data collectors 18 and 20 include signal conditioning circuitry, analog-to-digital conversion circuitry, and processing circuitry 34 for conditioning the vibration signals from the sensors 16 and for generating the scalar vibration data and time waveform vibration data based thereon. In a preferred embodiment, the vibration data collectors 18 and 20 also include a data buffer 32 for short-term data storage during data collection, and a data storage device 30 for longer-term storage. The time waveform digital vibration data are preferably stored in a vibration database 22 from which the data are available for analysis by software routines executed by a processor 36 of a vibration analysis computer 24. In preferred embodiments, the system 10 includes a user interface 28, such as a touch screen, that allows a user to view graphical plots of data, select certain measurement parameters, and provide other input as described herein.

Figure 2:
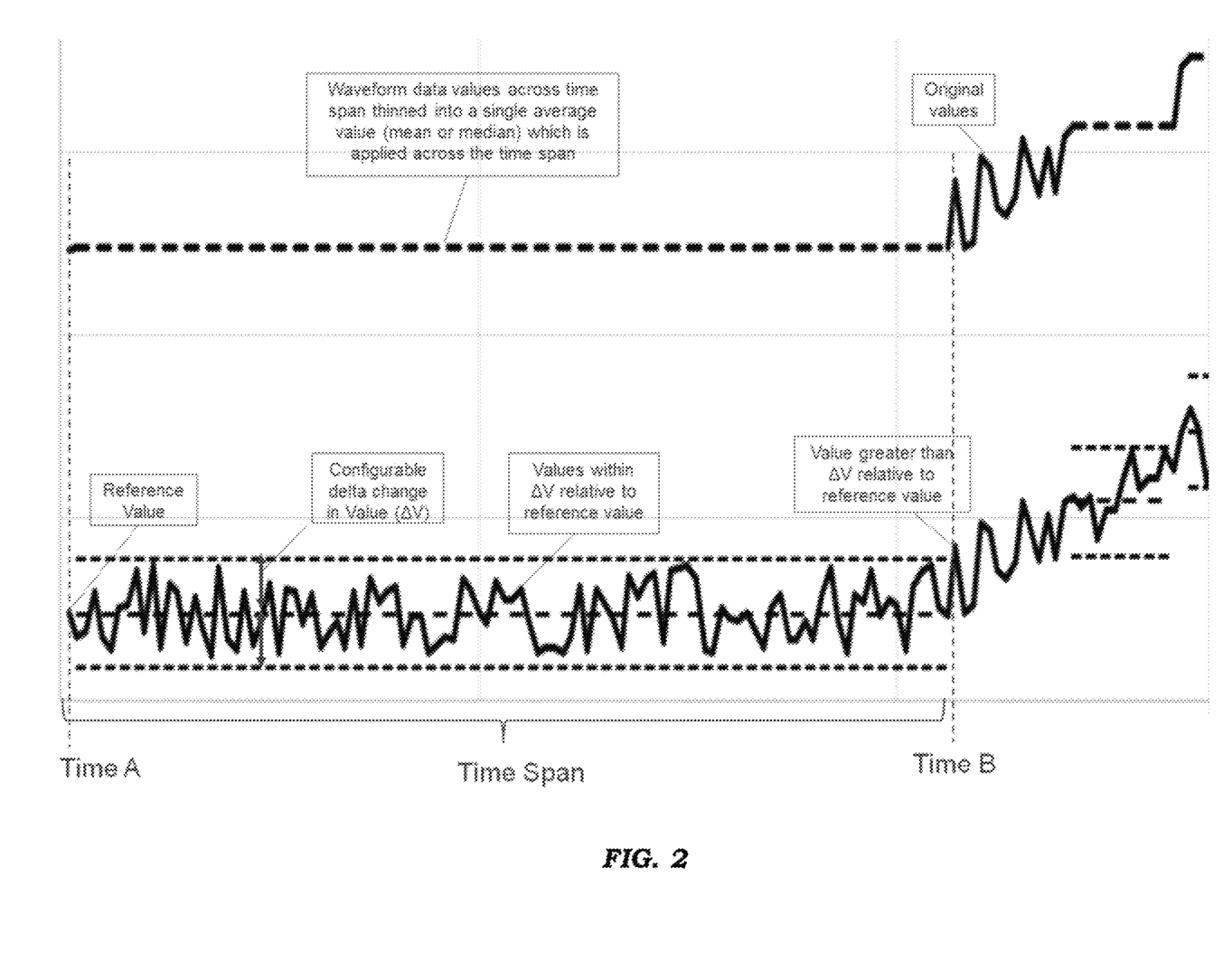
FIG. 2 depicts a plot of scalar measurement data that have been thinned according to an embodiment of the invention.

Preferred embodiments provide a scalar vibration data thinning process as graphically depicted in FIG. 2. This process generally involves:

(1) Establishing an amplitude range of the vibration measurement values (ΔV) that is small enough that no important machine diagnostic vibration information would be lost if all of the measurement values falling within that ΔV range were set to a single reference value. This ΔV range is the amplitude range between the horizontal dashed lines in FIG. 2.

(2) Setting the first measurement value as the reference value (at time A in FIG. 2), and discarding all subsequent measurement values that fall within the ΔV range until a measurement value falls outside the ΔV range.

(3) When a measurement value falls outside the ΔV range (at time B in FIG. 2), setting that measurement value as a new reference value, and repeat.

Figure 3:
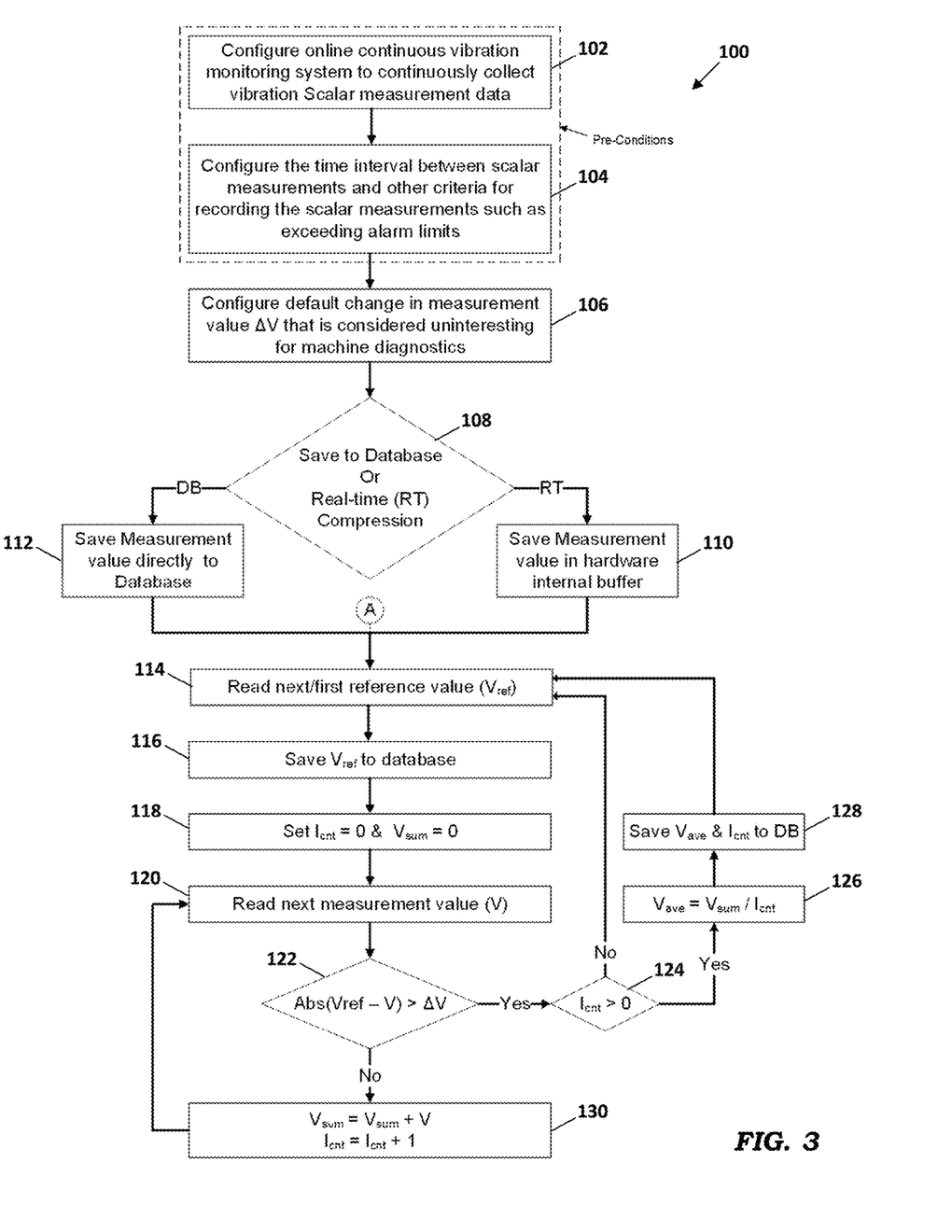
FIG. 3 depicts a method for thinning scalar measurement data according to an embodiment of the invention.

FIG. 3 depicts a preferred embodiment of the scalar vibration data thinning process 100. The first step is to configure the online vibration monitoring device 20 to continuously collect scalar vibration measurement data (step 102), including exception triggering if required. This configuration process may include configuring the time interval between recording scalar measurements, and other criteria such as recording the scalar measurements upon exceeding an alarm limit (step 104). Examples of scalar vibration measurements include Overall Vibration, PeakVue™, Demod, Spike Energy, Shock Pulse, Cepstrum, Periodicity, Crest Factor, Skewness, and Kurtosis.

The online vibration monitoring device 20 is also configured with a default value for the ΔV range for each scalar vibration measurement value (step 106). Because various scalar measurement values have unique units of measure, they will have unique ΔV ranges. As noted above, the default ΔV range for each scalar measurement value is preferably small enough that no important machine diagnostic vibration information is lost if all of the measurement values falling within the ΔV range were set to a single reference value.

At step 108, the online vibration monitoring device 20 is also configured to either save the scalar measurement data directly into the database 22 without thinning (step 112), in which case the data thinning process is performed by the vibration analysis computer 24 at a later time, or to save the scalar measurement data in internal data storage 30 of the online vibration monitoring device 20 (step 110) and perform the data thinning process within the online vibration monitoring device 20 in a real-time manner. The real-time processing option reduces the initial database storage requirements and reduces network traffic.

The preferred embodiment of the data thinning process begins with reading an initial vibration amplitude value (also referred to herein as a reference value $V_{ref}$) from the data storage device 30 or the database 22 (step 114), and saving $V_{ref}$ to the database (step 116). Initial values of a total number of discarded measurements ($I_{cnt}$) and a sum of the discarded amplitude values ($V_{sum}$) are set to zero (step 118). A next vibration amplitude value (V) is then read from the data storage device 30 or the database 22 (step 120), and the value V is compared to the ΔV range (step 122).

If the value V is within the ΔV range, then $V_{sum}$ is updated according to:

$$V_{sum}=V_{sum}+V$$

and $I_{cnt}$ is incremented according to:

$$I_{cnt}=I_{cnt}+1 (\text{step } 130),$$

and the process loops back to step 120 to read the next vibration measurement value V from the data storage device 30 or the database 22 and perform the next comparison at step 122.

If the value V is outside the ΔV range (step 122) and $I_{cnt}$ is greater than zero (step 124), then an average measurement value $V_{ave}$ is determined according to:

$$V_{ave}=V_{sum}/I_{cnt}(\text{step } 126),$$

and the values of $V_{ave}$ and $I_{cnt}$ are saved to the database 22 (step 128). (A slightly different process would be implemented to calculate a median value as an alternative approach.) The process then loops back to read a new reference measurement value $V_{ref}$ from the data storage device 30 or the database 22 (step 114), and steps 116 through 122 are repeated.

If the value V is outside the ΔV range (step 122) and $I_{cnt}$ is not greater than zero (step 124), then the process loops back to read a new reference measurement value $V_{ref}$ from the data storage device 30 or the database 22 (step 114), and steps 116 through 122 are repeated.

Figure 4:
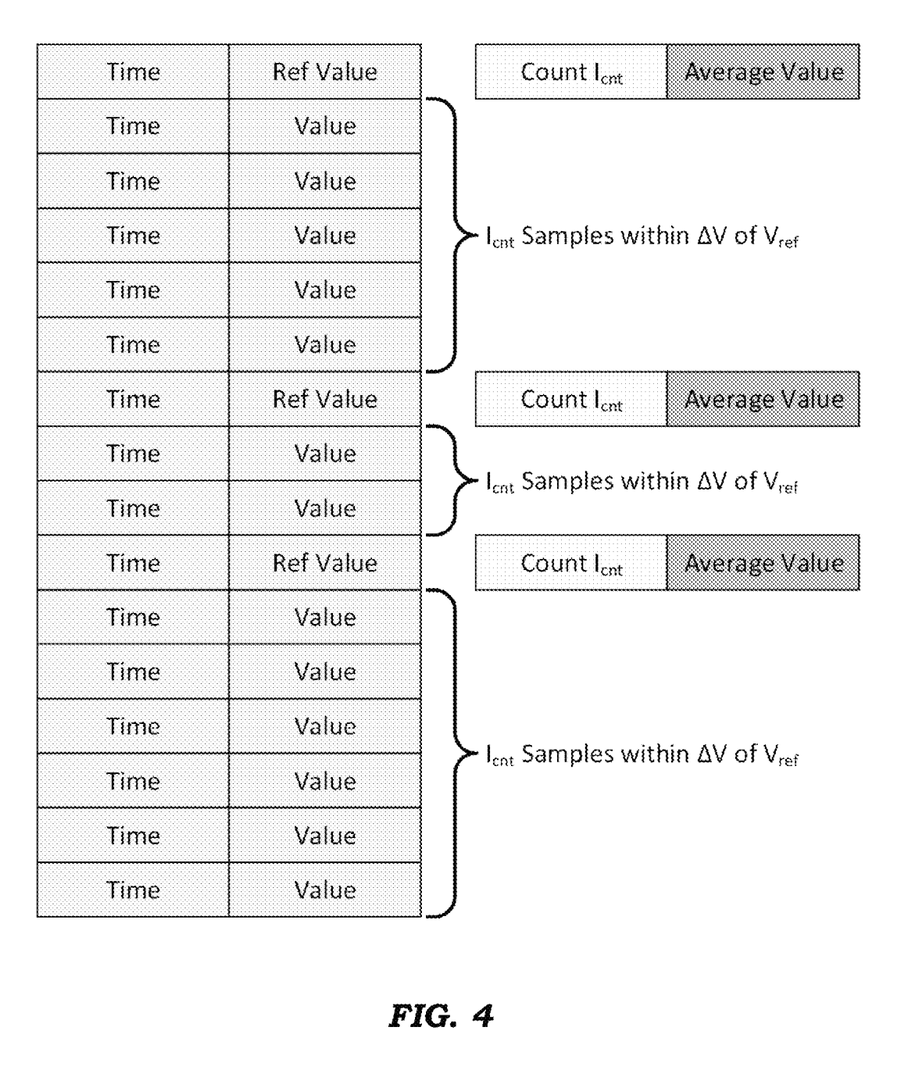
FIG. 4 depicts a structure for storing thinned measurement data in a database according to an embodiment of the invention.

Conceptually, saving the thinned measurement data in the database 22 is relatively straight forward process. In its simplest form, as depicted in FIG. 4, scalar vibration measurement data are stored as pairs of values, each including the sample time and the measurement value. In the preferred embodiment, these values are stored continuously over time. As described above, if the scalar measurement values are within the ΔV range, the data thinning process removes the unneeded data from the database 22, or in the case of real-time processing, does not save the unneeded data in the first place. This reduces the database storage requirements. Only the average of the discarded measurement values ($V_{ave}$) and the count of discarded measurement values ($I_{cnt}$) are stored in the database with reference to an initial or reference measurement sample time ($T_{ref}$). This time reference is needed so that when the thinned measurement data are restored, the appropriate gap in the measurement data can be reconstructed.

Figure 5:
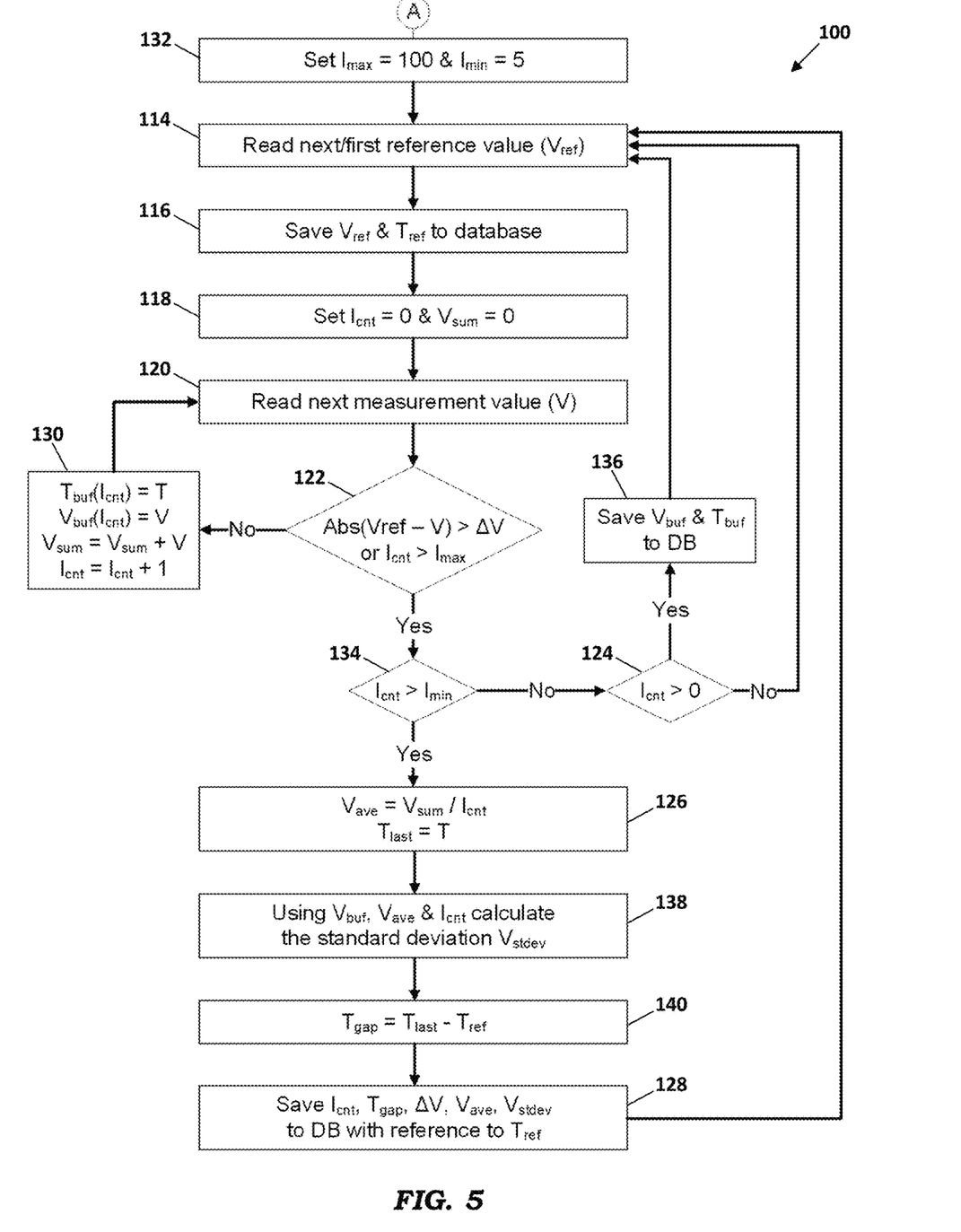
FIG. 5 depicts an enhanced method for thinning scalar measurement data according to an embodiment of the invention.

FIG. 5 depicts an enhanced process for thinning scalar vibration measurement data, which process includes some additional steps after point "A" in the process of FIG. 3. These additional steps involve recording and processing some additional values, including:

a value for the maximum number of thinned measurements ($I_{max}$);

a value for the minimum number of thinned measurements ($I_{min}$);

a value for the initial or reference measurement sample time ($T_{ref}$);
a value for the time gap created by removing the discarded data in the thinning process ($T_{gap}$);
a value for the time of the last sample in the gap ($T_{last}$), which is used in calculating $T_{gap}$;
a value for the standard deviation of the thinned measurement values ($V_{stdev}$); and
values for $V_{buf}$ and $T_{buf}$ which may be saved for comparison to the re-created data as described hereinafter, but which are preferably not saved, given the objective to reduce storage requirements.

As shown in FIG. 5, the enhanced process includes setting the initial values for $I_{max}$ and $I_{min}$ (step 132). The $I_{max}$ value is useful when the measurement data does not change significantly over a long period of time and ensures that intermediate real measurement data are saved. The $I_{min}$ value is important for avoiding a situation in which there is an unnecessary oscillation of reference and thinned data that does not save on data storage. In a preferred embodiment, $I_{max}$ is set at 100 (or more) measurements, and $I_{min}$ is set at five measurements.

Step 116 of the enhanced process includes saving the initial vibration measurement value $V_{ref}$ and the corresponding measurement sample time $T_{ref}$ to the database 22. As noted above, the $T_{ref}$ time reference is needed so that when the thinned measurement data are restored, the appropriate gap in the measurement data can be reconstructed.

At step 120, the next vibration measurement value V and its associated time value T are read from the data storage device 30 or the database 22.

At step 122, the value V is compared to the ΔV range, and the value $I_{cnt}$ is compared to $I_{max}$. If the value V is within the ΔV range or the value $I_{cnt}$ is not greater than $I_{max}$, then at step 130:

$$T_{buf}(I_{cnt})=T,$$

$$V_{buf}(I_{cnt})=V,$$

$$V_{sum}=V_{sum}+V, \text{ and}$$

$$I_{cnt}=I_{cnt}+1.$$

If the value V is outside the ΔV range or the value $I_{cnt}$ is greater than $I_{max}$ at step 122, then $I_{cnt}$ is compared to $I_{min}$ (step 134). If $I_{cnt}$ is greater than $I_{min}$, the process proceeds to step 126. If $I_{cnt}$ is not greater than $I_{min}$, the process proceeds to step 124.

At step 124, if $I_{cnt}$ is greater than zero, then the values of $V_{buf}$ and $T_{buf}$ are saved to the database 22 (step 136), and the process loops back to read a new reference measurement value $V_{ref}$ from the data storage device 30 or the database 22 (step 114), and steps 116 through 122 are repeated.

At step 126, the average measurement value $V_{ave}$ is determined according to $$V_{ave}=V_{sum}/I_{cnt},$$

and the value of $T_{last}$ is set to T. The value of $V_{stdev}$ is then calculated based on $V_{buf}$, $V_{ave}$, and $I_{cnt}$ (step 138). $V_{stdev}$ is useful for creating a visual representation of the thinned data on a trend plot as discussed hereinafter. $T_{gap}$ is then determined according to $$T_{gap}=T_{last}-T_{ref} \text{(step 140)}.$$

The $T_{gap}$ value is important to record so that a scalar trend plot can be accurately re-created. Typically—but not always—the time between scalar measurements is constant. However, the actual sample times of the discarded data are lost, and the only way to re-create a realistic trend plot is the know the gap time. This value is also needed for estimating the time between the missing samples, by dividing the gap time by the number of discarded samples.

The values of $I_{cnt}$, $T_{gap}$, ΔV, $V_{ave}$, and $V_{stdev}$ are then saved with reference to $T_{ref}$ in the database 22 (step 128), and the process loops back to read a new reference measurement value $V_{ref}$ from the data storage device 30 or the database 22 (step 114).

Figure 6:
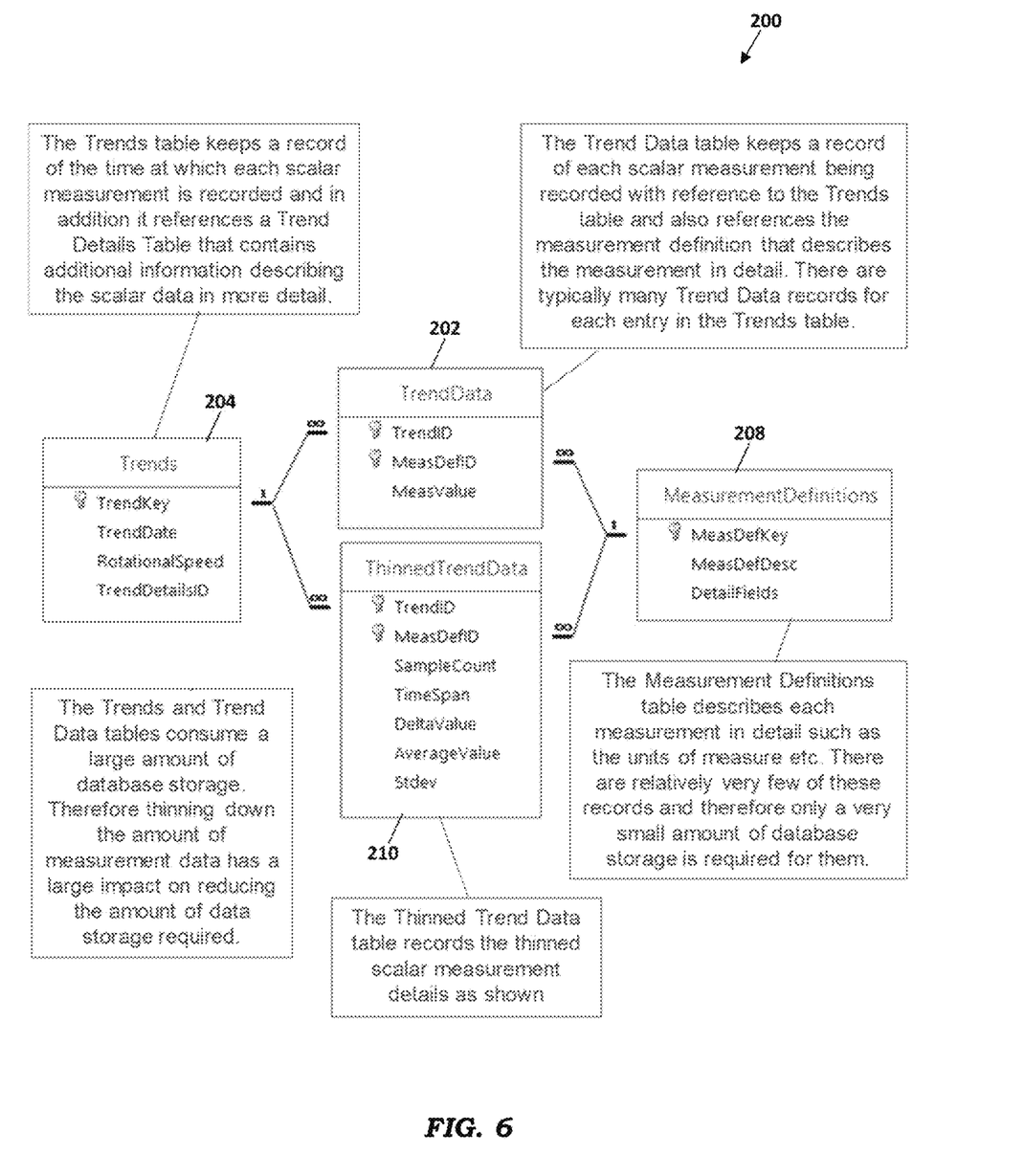
FIG. 6 depicts a relational database schema for saving thinned scalar vibration measurement data according to an embodiment of the invention.

FIG. 6 depicts a relational database schema 200 for saving thinned scalar vibration measurement data. The Trends table 204 provides a record of the time at which each scalar vibration measurement is recorded. It also references a Trends Details table that contains additional information describing the scalar data in more detail. The Trend Data table 202 provides a record of each recorded scalar vibration measurement with reference to the Trends table 204.

For each record in the Trends table 204, there are several—such as 10 or more—records in the Trend Data table 202, one for each type of measurement recorded. Although each of these records is relatively small, they ultimately consume a large amount of storage (such as gigabyte) over a relatively small amount of time, and typically in a plant that has many machines with multiple measurement locations on each machine. There are fewer trend records in the Trends table 204 than in the Trend Data table 202. However, the records in the Trends table 204 are typically relatively large and therefore also consume a large amount of space in the database 22. To effectively reduce the amount of database storage required for the scalar vibration measurements, one must not only reduce the number of records in the Trend Data table 202, but also the number of records in the Trends table 204. This is possible only if all the records in the Trend Data table 202 for a particular record in the Trends table 204 are simultaneously thinned out. When this is the case, the record in the Trends table 204 can also be removed. Fortunately, this is typically the case, because generally, when the machine is operating in a steady-state condition, all the measurements being recorded stabilize, and can therefore be simultaneously thinned out together with the Trends table record. This maximizes the reduction in database storage required.

The Trend Data table 202 also references the Measurement Definitions table 208 that describes each measurement in detail, including the units of measure. Because there are typically few of these records, the database 22 requires only a small amount of storage space for them. The Thinned Trend Data table 210 provides a record of the thinned scalar vibration measure details as listed in FIG. 6. The Trends table 204 and the Trend Data table 202 consume a considerably large amount of storage space in the database 22. Therefore, thinning down the measurement data has a large impact on reducing the amount of database storage space required.

The Trends table 204 typically has numerous "Detail" fields. As the data in most of these fields are relatively static, these fields are preferably placed in a separate table to reduce the overall database storage.

It is also important to optimize the size and number of all the fields in the Trends table 204, the Trend Data table 202, and the Thinned Trend Data table 210 to reduce the overall storage required for the scalar vibration measurements. For long term archival purposes, an external binary file structure is a preferred and optimum way to store the scalar vibration measurement data.

Figure 7:
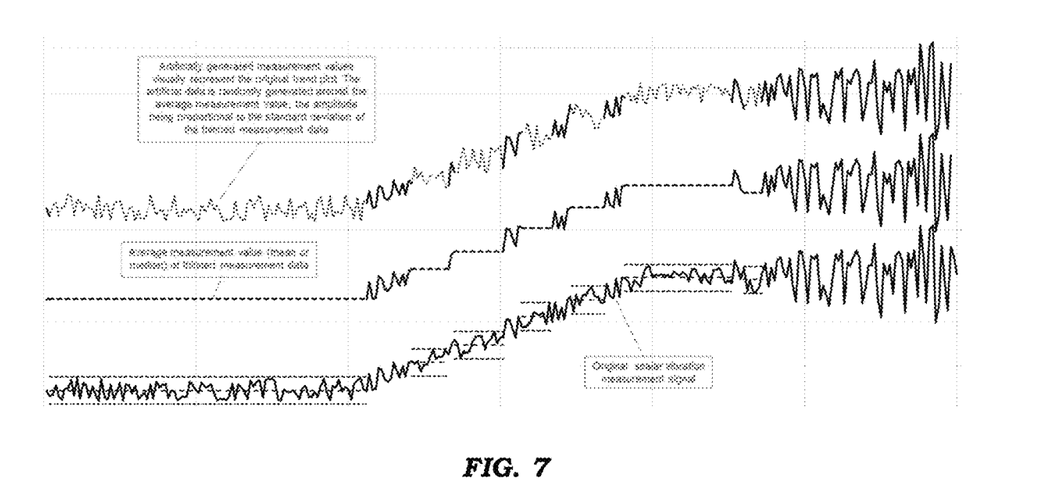
FIG. 7 depicts options for graphically displaying thinned scalar vibration measurement data according to an embodiment of the invention.

FIG. 7 depicts possible options for graphically displaying the thinned scalar vibration measurements. These options include:
Simply leaving a gap in the graphical display where the scalar data have been thinned (removed);
Graphically displaying the mean or median measurement values of the thinned original measurement values; and
Inserting artificially generated measurement values that visually represent the original trend plot. In one embodiment, the artificial data are randomly generated around the average measurement value, and the amplitudes of the artificial data are proportional to the standard deviation of the thinned measurement data.

Figure 8:
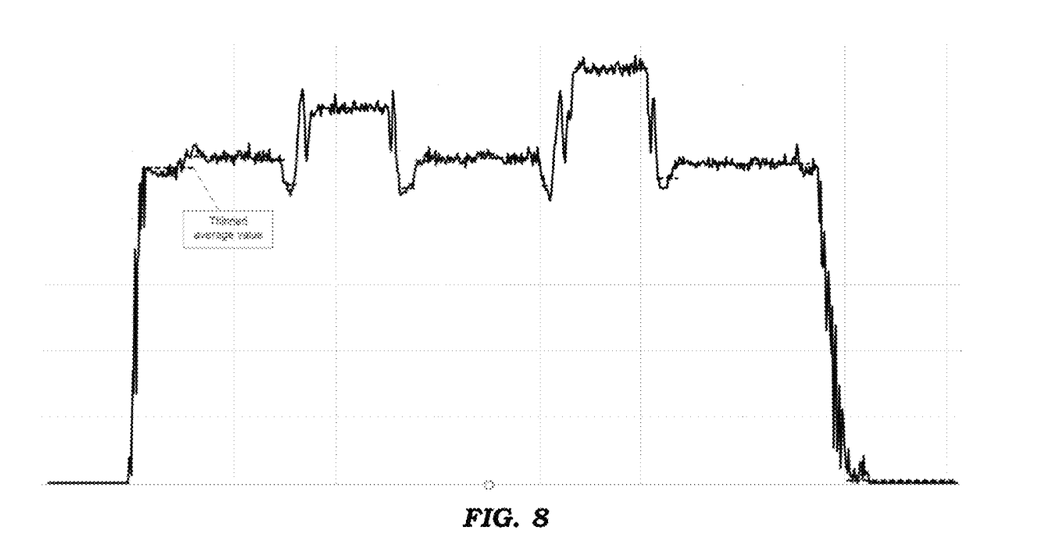
FIG. 8 depicts an example of thinned scalar vibration measurement data collected by an online vibration data monitoring device according to an embodiment of the invention.

FIG. 8 depicts an example of thinned scalar data collected by an online vibration data monitoring device. The horizontal dashed lines indicate the portions of data that have been thinned.

Figure 9:
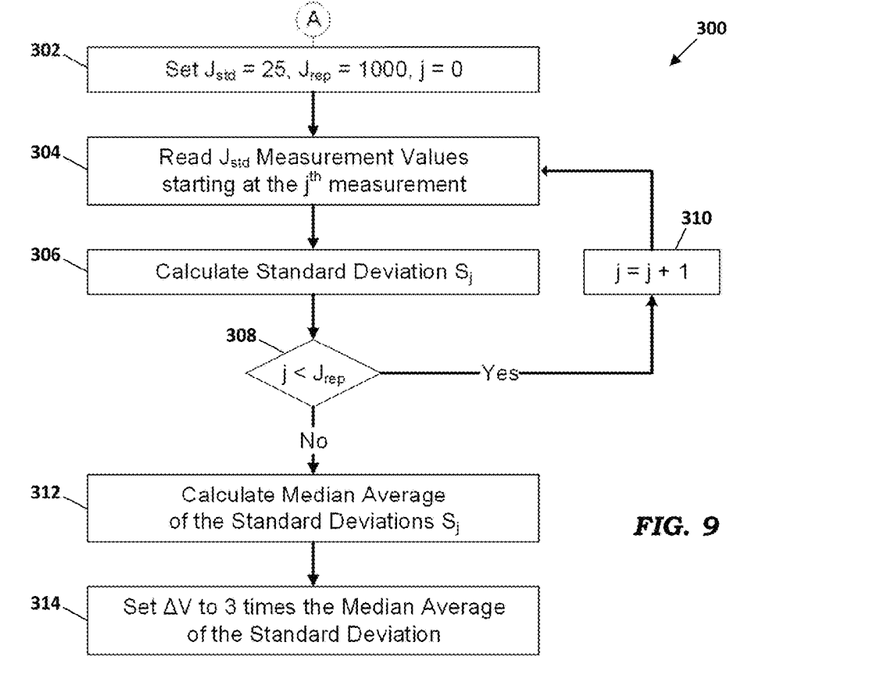
FIG. 9 depicts a process for determining an amplitude range based on a median value of a moving average standard deviation according to an embodiment of the invention.

FIG. 9 depicts a preferred embodiment of a process for determining the $\Delta V$ range based on a median value of a moving average standard deviation. As discussed previously herein, each scalar measurement typically has a unique unit of measure and therefore a unique range of values. Each of these scalar measurements requires a $\Delta V$ range that is small enough that discarded values within the range are considered unimportant as far as machine diagnostics are concerned. Although the user can initially set the $\Delta V$ range to some default value, it is desirable to estimate a more reliable or representative value. Finding the median value of a moving average standard deviation is one such method that provides a good measure of $\Delta V$.

As shown in FIG. 9, the method requires specifying the number of measurements ($J_{std}$) used in calculating the standard deviation, and a number of steps for the calculation ($J_{rep}$). For example, $J_{std}$ may be set to 25 and $J_{rep}$ may be set to 1000 steps (step 302). Starting at the jth measurement value, the $J_{std}$ number of measurement values are read one at a time and the moving standard deviations ($S_j$) are calculated (steps 304-310). The median average value of the standard deviations ($S_j$) is then calculated (step 312), and $\Delta V$ is set to three times the median average value (step 314). In the preferred embodiment, the median average is used rather than the average, because the median average progressively removes the largest and smallest values, thereby eliminating spikes in the data that would distort the $\Delta V$ range.

Figure 10:
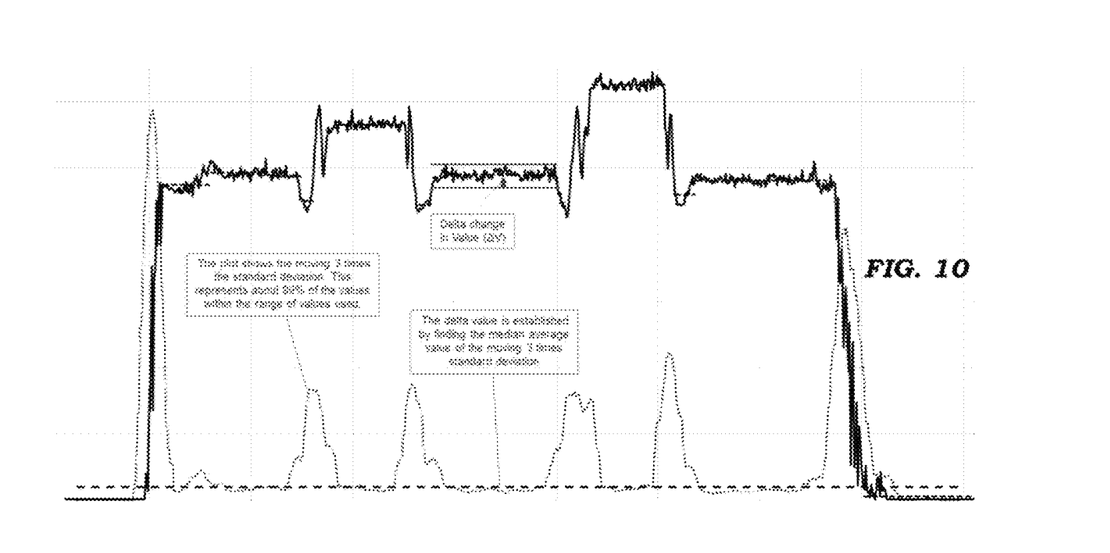
FIG. 10 depicts an example of thinned scalar vibration measurement data collected by an online vibration data monitoring device, with a plot of a moving three times the standard deviation calculated according to an embodiment of the invention.

FIG. 10 depicts the thinned scalar data of FIG. 8, along with a plot of the moving three times the standard deviation calculated in steps 304-310. The dashed line at the bottom of FIG. 10 indicates the median average of the moving three times the standard deviation for the corresponding region of thinned data.

The process of FIG. 9 is preferably repeated periodically, such as weekly or monthly, depending on the rate at which measurements are taken. Because this process is somewhat numerically intensive, it is preferable to not run it continuously.

Figure 11:
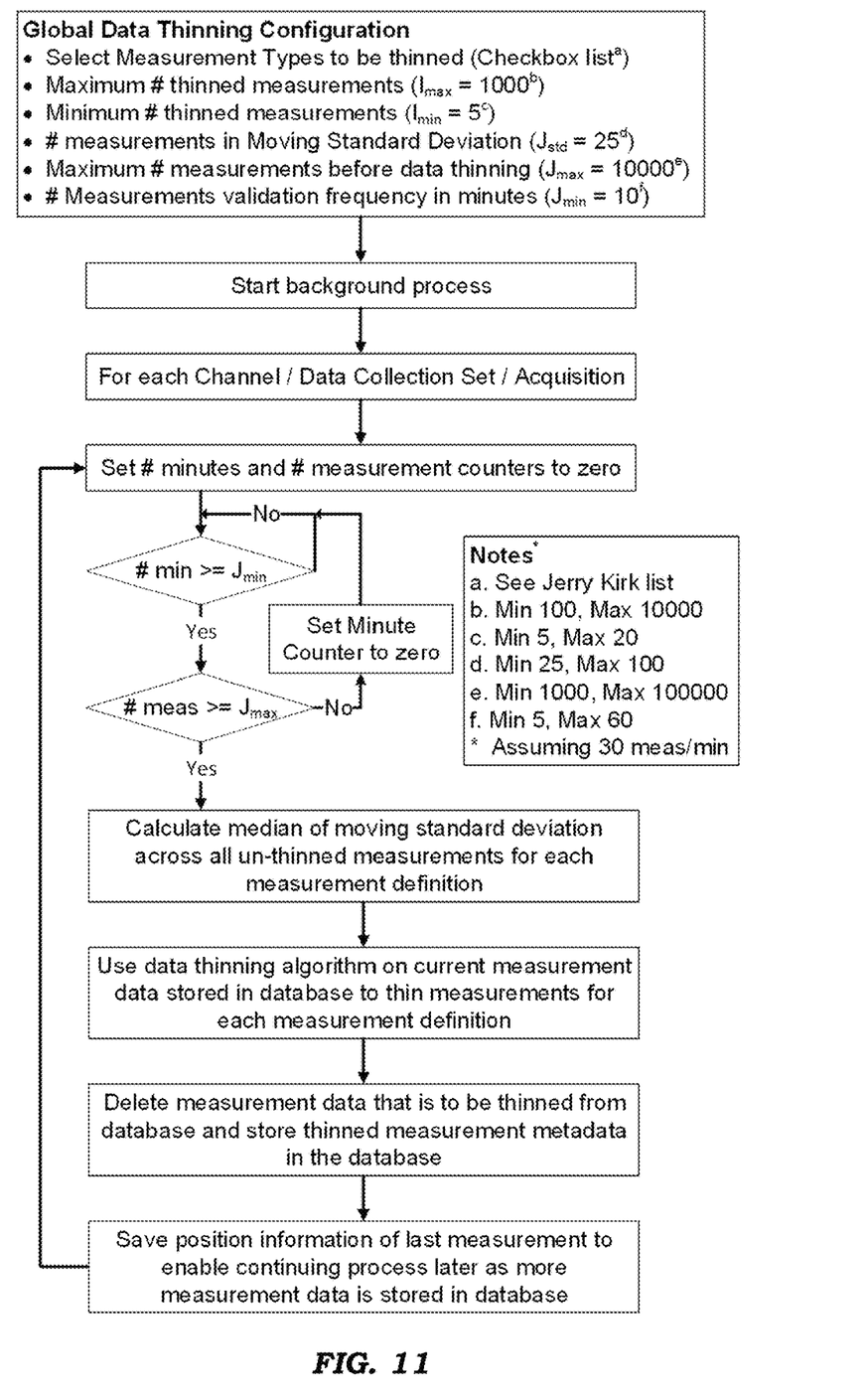
FIG. 11 depicts a software implementation flow of a scalar vibration measurement data thinning process according to an embodiment of the invention.

FIG. 11 depicts a software implementation flow for an embodiment of the scalar vibration measurement data thinning process. As the "Notes" box indicates, the preferred settings provide 30 measurements/second. Although different rates could be used, the ranges of the configuration parameters would require adjustment accordingly. In a preferred embodiment, the timer flowchart decision box is implemented by an event timer, and the minimum and maximum settings in the "Notes" box are implemented as preferences in the software. An alternative embodiment may include a waiting period (either in numbers of days or number of measurements) before applying the data thinning process. This would ensure that the user would have the option of seeing some full data before it is thinned.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A computer-implemented method for thinning scalar measurement data to reduce an amount of space needed in a second data storage device to save the scalar measurement data, wherein the scalar measurement data were initially recorded in a first data storage device during a measurement period, the method comprising:
   (a) accessing the scalar measurement data from the first data storage device;
   (b) setting an amplitude range to which a plurality of amplitude values of the scalar measurement data will be compared;
   (c) setting a first or subsequent one of the amplitude values as a reference amplitude value, and setting a time corresponding to the first or subsequent one of the amplitude values as a reference time value;
   (d) saving the reference amplitude value and the reference time value in the second data storage device;
   (e) accessing a next amplitude value of the plurality of amplitude values from the first data storage device;
   (f) determining whether an absolute difference between the reference amplitude value and the next amplitude value is greater than the amplitude range, and
   if the absolute difference between the reference amplitude value and the next amplitude value is not greater than the amplitude range:
      discarding the next amplitude value by not saving it in the second data storage device;
      calculating an average measurement value based on a sum of the discarded next amplitude value and previously discarded amplitude values that are adjacent in time to the discarded next amplitude value;
      calculating a time gap value indicating a total length of time associated with the discarded next amplitude value and previously discarded amplitude values that are adjacent in time to the discarded next amplitude value; and
      saving the average measurement value and the time gap value in the second data storage device, and proceeding to step (g),
   or
   if the absolute difference between the reference amplitude value and the next amplitude value is greater than the amplitude range:
      saving in the second data storage device the next amplitude value and a time at which the next amplitude value was recorded; and setting the next amplitude value as the reference amplitude value, and setting the time at which the next amplitude value was recorded as the reference time value; and (g) repeating steps (e) and (f) until all of the scalar measurement data recorded during the measurement period have been processed.

2. The method of claim 1 wherein step (b) further comprises setting the amplitude range based on a median value of a moving standard deviation of the plurality of amplitude values of the scalar measurement data across the measurement data recorded during the measurement period.

3. The method of claim 1 wherein the first data storage device comprises a data buffer in a vibration data collector, and the second data storage device comprises a data storage device in the vibration data collector, and steps (a) through (g) are performed in real-time as the vibration data collector records the scalar measurement data.

4. The method of claim 1 wherein the first data storage device comprises a data storage device in a vibration data collector, and the second data storage device comprises a vibration database, and steps (a) through (g) are performed after the scalar measurement data has been recorded in the data storage device of vibration data collector.

5. The method of claim 1 further comprising generating an amplitude versus time graphical plot of the scalar measurement data stored in the second data storage device, wherein the graphical plot includes one or more data gaps caused by discarding amplitude values in step (f), wherein the one or more data gaps have a time length corresponding to the time gap value, and wherein the amplitude values discarded in step (f) are replaced in the one or more data gaps by the average measurement value.

6. The method of claim 1 further comprising generating an amplitude versus time graphical plot of the scalar measurement data stored in the second data storage device, wherein the graphical plot includes one or more data gaps caused by discarding amplitude values in step (f), wherein the one or more data gaps have a time length corresponding to the time gap value, and wherein the amplitude values discarded in step (f) are replaced in the one or more data gaps by artificially-generated amplitude values having amplitudes that are randomly distributed around the average measurement value.

7. An apparatus for thinning scalar measurement data to reduce an amount of space needed to save the scalar measurement data, comprising:
a first data storage device in which the scalar measurement data were initially recorded during a measurement period;
a second data storage device in which the scalar measurement data are stored after thinning;
a processor in communication with the first and second data storage devices, the processor executing instructions to:
(a) access the scalar measurement data from the first data storage device;
(b) set an amplitude range to which a plurality of amplitude values of the scalar measurement data will be compared;
(c) set a first or subsequent one of the amplitude values as a reference amplitude value, and set a time corresponding to the first or subsequent one of the amplitude values as a reference time value;
(d) save the reference amplitude value and the reference time value in the second data storage device;

(e) access a next amplitude value of the plurality of amplitude values from the first data storage device;
(f) determine whether an absolute difference between the reference amplitude value and the next amplitude value is greater than the amplitude range, and
if the absolute difference between the reference amplitude value and the next amplitude value is not greater than the amplitude range:
discard the next amplitude value by not saving it in the second data storage device;
calculate an average measurement value based on a sum of the discarded next amplitude value and previously discarded amplitude values that are adjacent in time to the discarded next amplitude value;
calculate a time gap value indicating a total length of time associated with the discarded next amplitude value and previously discarded amplitude values that are adjacent in time to the discarded next amplitude value; and
save the average measurement value and the time gap value in the second data storage device, and proceed to step (g),
or
if the absolute difference between the reference amplitude value and the next amplitude value is greater than the amplitude range:
save in the second data storage device the next amplitude value and a time at which the next amplitude value was recorded; and
set the next amplitude value as the reference amplitude value, and set the time at which the next amplitude value was recorded as the reference time value; and
(g) repeat steps (e) and (f) until all of the scalar measurement data recorded during the measurement period have been processed.

8. The apparatus of claim 7 wherein the processor sets the amplitude range based on a median value of a moving standard deviation of the plurality of amplitude values of the scalar measurement data across the measurement data recorded during the measurement period.

9. The apparatus of claim 7 wherein:
the first data storage device comprises a data buffer in a vibration data collector;
the second data storage device comprises a data storage device in the vibration data collector; and
the processor executes the instructions to perform steps (a) through (g) in real-time as the vibration data collector records the scalar measurement data.

10. The apparatus of claim 7 wherein:
the first data storage device comprises a data storage device in a vibration data collector;
the second data storage device comprises a vibration database; and
the processor executes the instructions to perform steps (a) through (g) after the scalar measurement data has been recorded in the data storage device of vibration data collector.

11. The apparatus of claim 10 wherein the processor generates an amplitude versus time graphical plot of the scalar measurement data stored in the second data storage device, wherein the graphical plot includes one or more data gaps caused by discarding amplitude values in step (f), wherein the one or more data gaps have a time length corresponding to the time gap value, and wherein the amplitude values discarded in step (f) are replaced in the one or more data gaps by the average measurement value.

12. The apparatus of claim 10 wherein the processor generates an amplitude versus time graphical plot of the scalar measurement data stored in the second data storage device, wherein the graphical plot includes one or more data gaps caused by discarding amplitude values in step (f), wherein the one or more data gaps have a time length corresponding to the time gap value, and wherein the amplitude values discarded in step (f) are replaced in the one or more data gaps by artificially-generated amplitude values having amplitudes that are randomly distributed around the average measurement value.

\* \* \* \* \*